(12) United States Patent
Chang et al.

(10) Patent No.: US 11,784,627 B2
(45) Date of Patent: Oct. 10, 2023

(54) LAMB WAVE RESONATOR AND METHOD OF FABRICATING THE SAME

(71) Applicant: Vanguard International Semiconductor Corporation, Hsinchu (TW)

(72) Inventors: Chin-Yu Chang, Taipei (TW); Yen-Lin Chen, Tainan (TW); Chien-Hui Li, Yilan County (TW); Tai-I Yang, Hsinchu (TW); Yung-Hsiang Chen, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 480 days.

(21) Appl. No.: 17/163,580

(22) Filed: Feb. 1, 2021

(65) Prior Publication Data

US 2022/0247378 A1 Aug. 4, 2022

(51) Int. Cl.
*H03H 9/17* (2006.01)
*H03H 3/02* (2006.01)

(52) U.S. Cl.
CPC .............. *H03H 9/17* (2013.01); *H03H 3/02* (2013.01)

(58) Field of Classification Search
CPC ...................................................... H03H 9/17
See application file for complete search history.

(56) References Cited

U.S. PATENT DOCUMENTS

| 7,075,390 | B1* | 7/2006 | Bungo | ............... | H03H 9/14505 310/313 A |
|---|---|---|---|---|---|
| 8,552,618 | B2 | 10/2013 | Okumichi | | |
| 2009/0314062 | A1 | 12/2009 | Tsuyoshi | | |
| 2013/0134838 | A1* | 5/2013 | Yun | ..................... | H03H 9/02228 29/25.35 |
| 2019/0296713 | A1 | 9/2019 | Bhattacharjee | | |
| 2020/0052675 | A1* | 2/2020 | Kanazawa | ........... | H03H 9/6409 |

FOREIGN PATENT DOCUMENTS

| JP | 2008-543157 | 11/2008 |
|---|---|---|
| JP | 2015-144418 | 8/2015 |
| TW | 202044756 A | 12/2020 |
| WO | 2018/216417 A | 11/2018 |

* cited by examiner

*Primary Examiner* — Samuel S Outten
(74) *Attorney, Agent, or Firm* — Winston Hsu

(57) ABSTRACT

A Lamb wave resonator includes a piezoelectric material layer, a first finger electrode, a second finger electrode, at least two floating electrodes, and at least two gaps. The first finger electrode is disposed on one side of the piezoelectric material layer and includes a first main portion and first fingers. The second finger electrode is disposed on the side of the piezoelectric material layer and includes a second main portion and second fingers. The first fingers are parallel to and alternately arranged with the second fingers. The floating electrodes are disposed between each first finger and each second finger, and the gaps are disposed at two ends of each floating electrode, respectively.

19 Claims, 15 Drawing Sheets

LAMB WAVE RESONATOR AND METHOD OF FABRICATING THE SAME

BACKGROUND OF THE INVENTION

1. Field of the Invention

The present disclosure relates to a resonator, and more particularly to a Lamb wave resonator and a method of fabricating the same.

2. Description of the Prior Art

In the 5G communication industry, it is necessary to configure a suitable filter in communication devices, such as a filter for radio frequency (RF) electronic signal, so as to enable the specific signal in the electromagnetic signal to be input to the signal processor in the communication device, or to enable the radio frequency electronic signal to be output from the communication device.

Generally, a resonator could be used as a filter for electrical signals. For example, the resonator may be a Lamb wave resonator including a piezoelectric layer and finger electrodes, and the finger electrodes could include several branches arranged at equal pitches. By adjusting the pitches between the branches, the resonance frequency of the resonator could be modulated, so that electrical signals with specific frequencies would pass through the resonator, while electrical signals with other frequencies would be filtered out by the resonator.

However, since the resonance frequency of the resonator is related to the pitches between the branches in the resonator, it is often necessary to not only redesign the layout of the corresponding branches of the resonator but also fabricate reticles with the redesigned layout when the electrical signals in different frequency ranges need to be filtered by the resonator.

Therefore, it is necessary to provide an improved Lamb wave resonator and its fabricating method to solve the problems faced by the conventional Lamb wave resonator.

SUMMARY OF THE INVENTION

In view of this, the present disclosure provides a Lamb wave resonator and its fabrication method to solve the technical problems faced by prior art.

According to one embodiment of the present disclosure, a Lamb wave resonator is provided and includes a piezoelectric material layer, a first finger electrode, a second finger electrode, at least two floating electrodes, and at least two gaps. The first finger electrode is disposed on one side of the piezoelectric material layer and includes a first main portion and first fingers. The second finger electrode is disposed on the side of the piezoelectric material layer and includes a second main portion and second fingers. The first fingers are parallel to and alternately arranged with the second fingers. The floating electrodes are disposed between each first finger and each second finger, and the gaps are disposed at two ends of each floating electrode, respectively.

According to one embodiment of the present disclosure, a method of fabricating a Lamb wave resonator is provided and includes at least following steps: providing a piezoelectric material layer; forming a first finger electrode on one side of the piezoelectric material layer, wherein the first finger electrode comprises a plurality of first branches; forming a dielectric layer covering the piezoelectric material layer and the first branches; forming at least one first opening in the dielectric layer, wherein the at least one first opening overlaps portions of the first branches; and removing the portions of the first branches overlapping the at least one first opening to thereby form at least two first floating electrodes.

According to the embodiments of the present disclosure, by cutting off the branches with a specific pitch, the resonance frequency of the modified Lamb wave resonator, such as the resonance frequency in $S_0$ mode, could be down to a lower value compared with the resonance frequency of the original Lamb wave resonator. Therefore, for fabricating Lamb wave resonators with different resonance frequencies, it is not necessary to redesign the layout or pitches of the branches of the finger electrodes for each Lamb wave resonator, but only use a reticle with a specific layout of finger electrodes followed by a removal process to cut off the branches with a specific pitches, by which the resonance frequency of the modified Lamb wave resonator could be lower than the resonance frequency of the original Lamb wave resonator.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
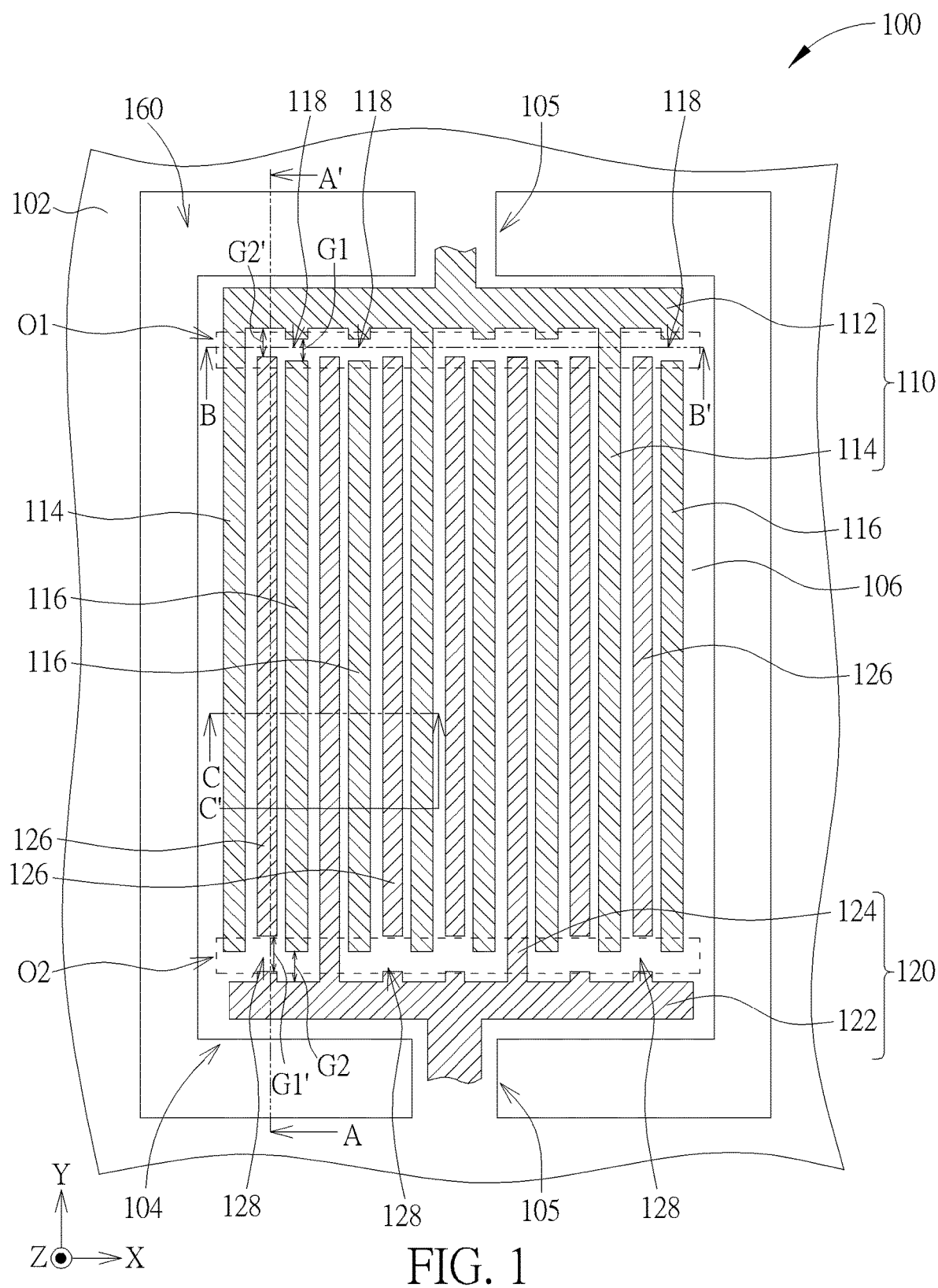
FIG. 1 is a schematic top view of a Lamb wave resonator according to one embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting.

The present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "over," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

In this disclosure, when referring to "adjacent first branch and second branch" or substantially the same description, it means that there are no additional first branch and second branch between that first branch and that second branch, but there may be floating electrodes between that first branch and that second branch. When referring to "two adjacent first branches" or substantially the same description, it means that there is no additional first branch between the first branches, but there may be a second branch or a floating electrode between the first branches and the used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

The terms, such as "coupled to" and "electrically connected to" disclosed herein encompass all means of directly and indirectly electrical connection. For example, when an element or layer is referred to as being "coupled to" or "electrically connected to" another element or layer, it may be directly coupled or electrically coupled to the other element or layer, or intervening elements or layers may be presented.

Although the disclosure is described with respect to specific embodiments, the principles of the invention, as defined by the claims appended herein, may obviously be applied beyond the specifically described embodiments of the invention described herein. Moreover, in the description of the present disclosure, certain details have been left out in order to not obscure the inventive aspects of the disclosure. The details left out are within the knowledge of a person of ordinary skill in the art.

FIG. 1 is a schematic top view of a Lamb wave resonator according to one embodiment of the present disclosure. Referring to FIG. 1, a Lamb wave resonator 100 may include a frame portion 102 and a suspension portion 104, wherein the frame portion 102 may surround the periphery of the suspension portion 104, and the frame portion 102 may be connected to the suspension portion 104 through an anchor portion 105. There may be a cavity or space 160 below the suspension portion 104 and between the suspension portion 104 and the frame portion 102, so the suspension portion 104 may oscillate in the cavity or space 160 when the Lamb wave resonator 100 resonates. According to one embodiment of the present disclosure, the suspension portion 104 may include a piezoelectric material layer 106, a first finger electrode 110, a second finger electrode 120, first floating electrodes 116, second floating electrodes 126, and a dielectric layer (not shown). In this disclosure, the technical term "floating electrode" refers to an electrode that is electrically insulated from or not electrically coupled to both the first finger electrode 110 and the second finger electrode 120, so that an electron flow or current could not be directly transmitted from the first finger electrode 110 or the second finger electrode 120 to the floating electrode.

The piezoelectric material layer 106 may have a length or width of about 10 μm to 500 μm and a thickness of about 0.1 μm to 2 μm. The top side of the piezoelectric material layer 106 may be used to support the first finger electrode 110, the second finger electrode 120, the first floating electrodes 116, and the second floating electrodes 126.

The dielectric layer (not shown) may be disposed on the piezoelectric material layer 106 so that the dielectric layer may cover the first finger electrode 110, the second finger electrode 120, the first floating electrodes 116, and the second floating electrodes 126. The dielectric layer may have openings therein, such as a first opening O1 and a second opening O2 disposed on opposite sides of the suspension portion 104. According to one embodiment of the present disclosure, the first opening O1 may be a strip-shaped opening extending in a specific direction (e.g., x direction), and is disposed corresponding to two ends of each of the first floating electrodes 116, the ends which are adjacent to the main portion 112; the second opening O2 may be a strip-shaped opening extending in the same direction (e.g., X direction), and is disposed corresponding to two ends of each of the second floating electrodes 126, the ends which are adjacent to the second main portion 122.

According to one embodiment of the present disclosure, the first finger electrode 110 and the second finger electrode 120 are arranged in a way that they are interdigitated. The first finger electrode 110 may include a first main portion 112 and several first branches 114 electrically coupled to the first main portion 112, while the second finger electrode 120 may include a second main portion 122 and several second branches 124 electrically coupled to the second main portion 122. The first branches 114 of the first finger electrode 110 and the second branches 124 of the second finger electrode 120 may be parallel to each other, for example, both extend along the y direction, and the first branches 114 and the second branches 124 may be alternately arranged along a specific direction (e.g., the x direction). For the first floating electrodes 116, a first gap G1 may exist between one end of each first floating electrode 116 and the first main portion 112, and a second gap G2 may exist between the other end of each first floating electrode 116 and the second finger electrode 120. The first gap G1 may be used to accommodate a first isolation region 118, such as cavity, and each first isolation region 118 may at least partially overlap with the first opening O1 in the dielectric layer. Similarly, for the second floating electrodes 126, a first gap G1' may exist between one end of each second floating electrode 126 and the second main portion 122, and a second gap G2' may exist between the other end of each second floating electrode 126 and the first finger electrode 110. The first gap G1' may be used to accommodate a second isolation region 128, such as cavity, and each second isolation region 128 may at least partially overlap with the second opening O2 in the dielectric layer.

One of the first finger electrode 110 and the second finger electrode 120 may be electrically coupled to a signal input terminal, and the other one may be electrically coupled to a signal output terminal, so that the electrical signal received from the input terminal and then transmitted to the Lamb wave resonator 100 may be filtered by the Lamb wave resonator 100, and the required electrical signal may then be transmitted from the Lamb wave resonator 100 to the output terminal. According to one embodiment of the present disclosure, the width of each first branch 114 and each second branch 124 may be in a range of 0.1 µm to 1.0 µm, but not limited thereto.

According to one embodiment of the present disclosure, each first floating electrode 116 and each second floating electrode 126 may be disposed between each first branch 114 and each second branch 124 adjacent to that first branch 114. In addition, each first floating electrode 116 and each second floating electrode 126 may also be disposed between two adjacent first branches 114 or between two adjacent second branches 124. In addition, the first floating electrodes 116 and the second floating electrodes 126 may appear in pairs between every first branch 114 and every second branch 124 adjacent to the first branch 114, may appear in pairs between every two adjacent first branches 114, and may appear in pairs between every two adjacent second branches 124.

Figure 2:
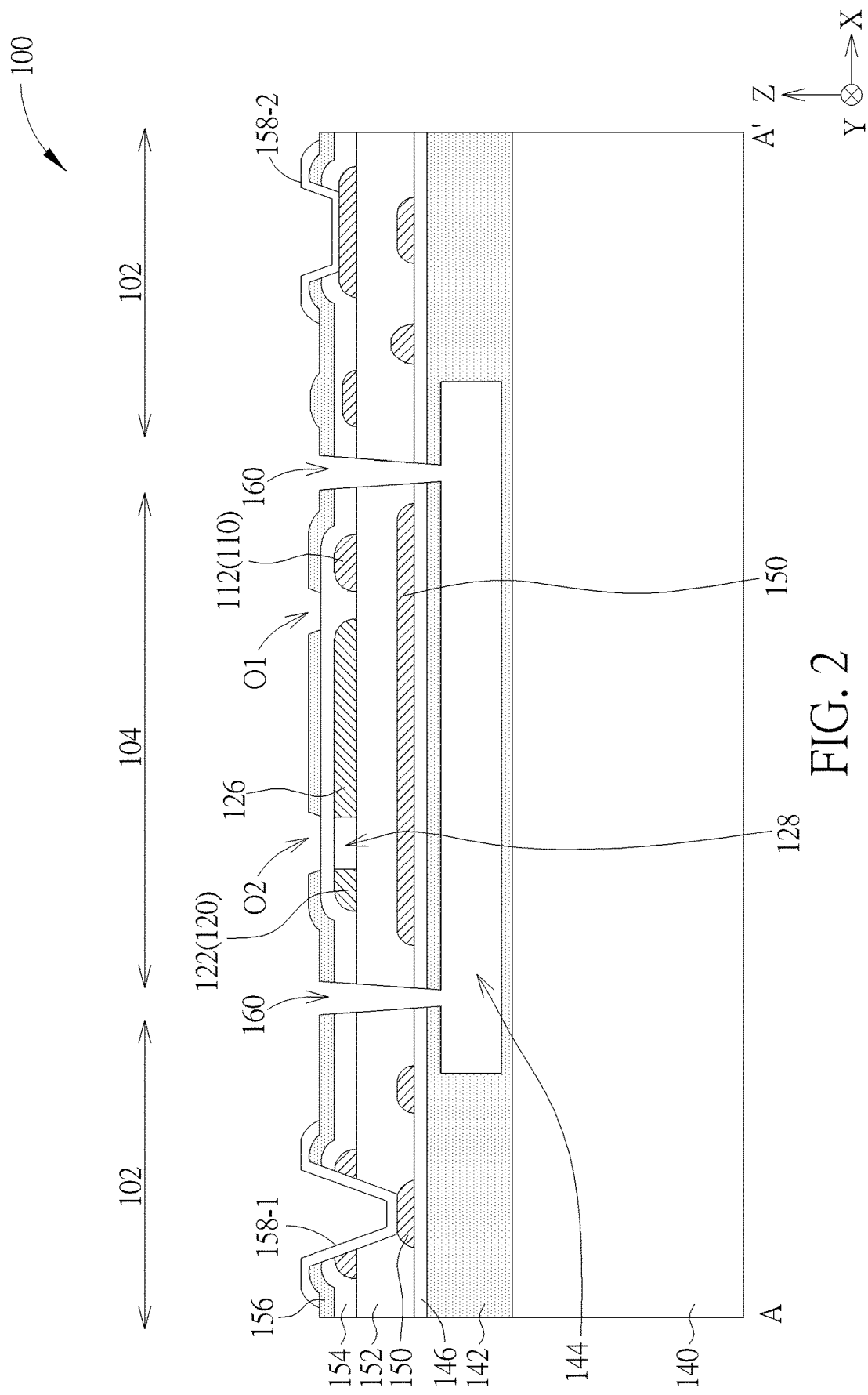
FIG. 2 is a schematic cross-sectional view taken along the line A-A' of FIG. 1 according to one embodiment of the present disclosure

FIG. 2 is a schematic cross-sectional view taken along the line A-A' of FIG. 1 according to one embodiment of the present disclosure. Referring to FIG. 2, the Lamb wave resonator 100 may include a substrate 140, such as a semiconductor substrate or an insulating substrate, so that the frame portion 102 and the suspension portion 104 may be disposed on the substrate 140. According to one embodiment of the present disclosure, at least a dielectric base layer 142, an optional seed layer 146, an optional bottom electrode 150, a piezoelectric material layer 152, a top electrode (e.g., the first finger electrode 110 and the second finger electrode 120), a floating electrode (e.g., the second floating electrodes 126), a passivation layer 154, a dielectric layer 156, and conductive contact pads (e.g. a first contact pad 158-1 and a second contact pad 158-2) are disposed on the substrate 140. In addition, the space 160 is between the suspension portion 104 and the frame portion 102, and a cavity 144 is below the suspension portion 104.

According to one embodiment of the present disclosure, the material of the dielectric base layer 142 may be different from those of the substrate 140 and the seed layer 146. The dielectric base layer 142 in the frame portion 102 may be relatively thick in order to fix the frame portion 102 to the substrate 140, while the dielectric base layer 142 in the suspension portion 104 may be relatively thin in order to avoid affect the resonance of the suspension portion 104. According to one embodiment of the present disclosure, the seed layer 146 may be, for example, $SiO_2$, SiON, AlN, or AlScN, which may be disposed between the bottom electrode 150 and the dielectric base layer 142, and the surface texture of the seed layer 146 may affect the crystallinity of each layer deposited on the seed layer 146.

A top electrode (e.g., the first finger electrode 110 and the second finger electrode 120) and a bottom electrode 150 may be respectively disposed on opposite sides of the piezoelectric material layer 152, e.g., the top side and the bottom side of the piezoelectric material layer 152, and a floating electrode (e.g., the second floating electrodes 126) may be located on the same side as the top electrode. According to one embodiment of the present disclosure, the top electrode, the bottom electrode 150, and the floating electrode may be conductive material made of molybdenum (Mo), titanium (Ti), aluminum (Al), platinum (Pt), or alloys thereof, but are not limited thereto. The first finger electrode 110, the second finger electrode 120, and the bottom electrode 150 may be electrically coupled to the corresponding conductive contact pads, for example, the conductive contact pads including the first contact pad 158-1 and the second contact pad 158-2. In this way, the first finger electrode 110, the second finger electrode 120, and the bottom electrode 150 may be grounded or capable of receiving/transmitting electrical signals. The piezoelectric material layer 152 may be, for example, a piezoelectric material made of AlN, AlScN, PZT, ZnO, PVDF, PMN-PT, but is not limited thereto.

The passivation layer 154 may be used to passivate and/or protect the underlying piezoelectric material layer 152, the top electrode, and the floating electrode. According to one embodiment of the present disclosure, the passivation layer 154 may be made of $SiO_2$, SiON, AlN, AlScN, PZT, ZnO, PVDF, PMN-PT, but is not limited thereto. In addition, the passivation layer 154 may fill up the spacing between the first finger electrode 110 and the second finger electrode 120. A dielectric layer 156 may cover the passivation layer 154, and the first opening O1 and the second opening O2 are formed in the dielectric layer 156. According to one embodiment of the present disclosure, a second isolation region 128 may be correspondingly disposed below the bottom surface of the second opening O2, such as a cavity filled with air or a cavity containing a trace of metal oxide or metal nitride, and a relatively thin passivation layer 154 may exist between the second opening O2 and the second isolation region 128.

Figure 3:
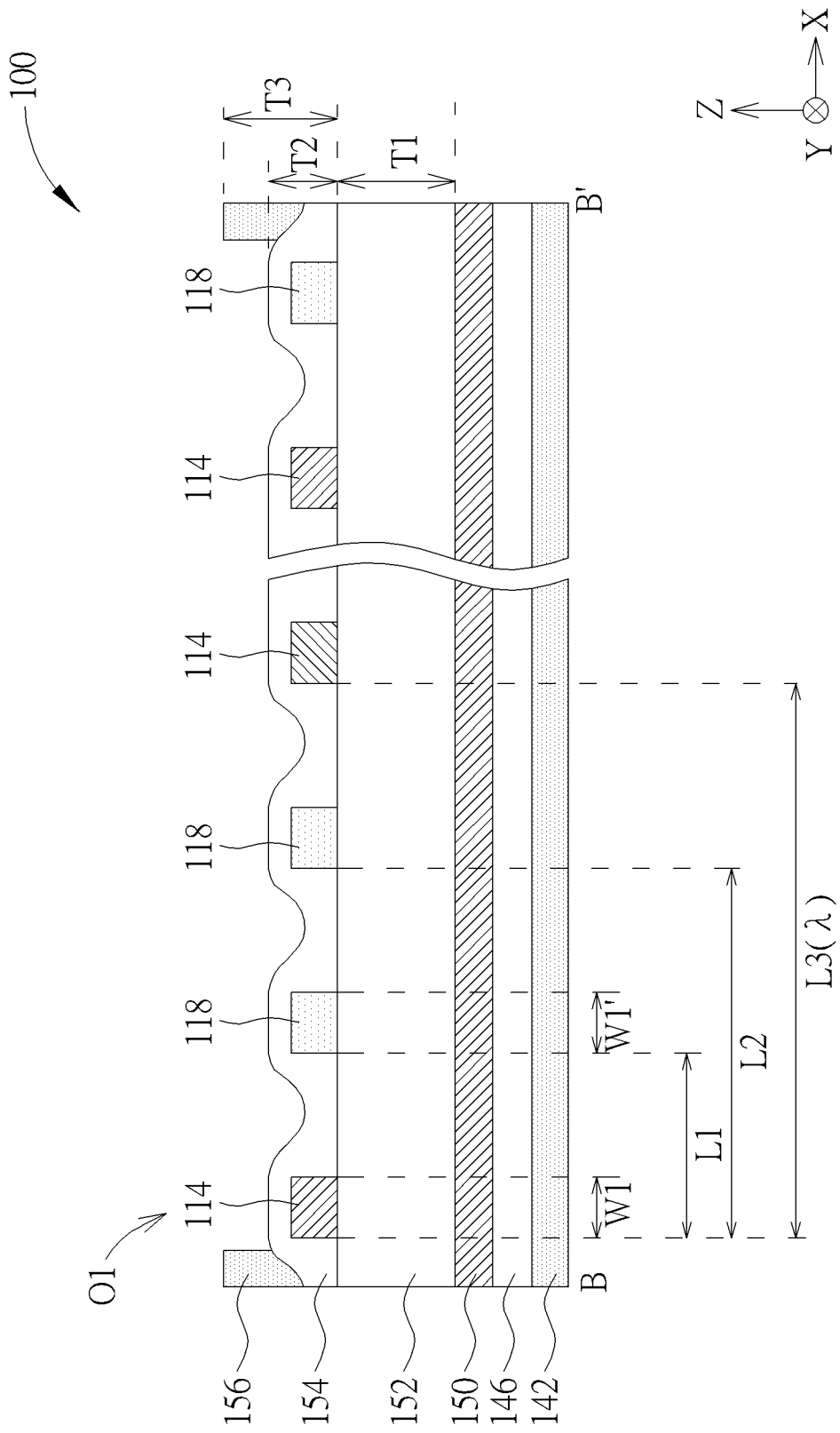
FIG. 3 is a schematic cross-sectional view taken along the line B-B' of FIG. 1 according to one embodiment of the present disclosure.

FIG. 3 is a schematic cross-sectional view taken along the line B-B' of FIG. 1 according to one embodiment of the present disclosure. Referring to FIG. 3, the thickness T1 of the piezoelectric material layer 152 may be greater than the thickness T2 of the passivation layer 154 or the total thickness T3 of the passivation layer 154 and the dielectric layer 156. According to one embodiment of the present disclosure, the passivation layer 154 may fill up the spacing between the first branches 114 and may cover the top surfaces of the first branches 114 and the first isolation region 118. The first opening O1 in the dielectric layer 156 may expose the top surface of the passivation layer 154. According to one embodiment of the present disclosure, a pair of first isolation regions 118, such as cavities filled with air or containing a trace of metal oxide or metal nitride, may be disposed between two adjacent first branches 114. The width W1 of the first isolation region 118 may be approximately equal to the width w1 of the first branch 114 since the first isolation region 118 may be obtained by laser cutting portions of the first branches 114. In addition, the pitches between the first isolation regions 118 and the first branch 114 may include a first distance L1 and a second distance L2, and the pitch between two adjacent first branches 114 may be a third distance L3. The first distance L1, the second distance L2 and the third distance L3 may form arithmetic progression, but are not limited to this. According to one embodiment of the present disclosure, the Lamb wave wavelength λ of the Lamb wave resonator 100 is approximately equal to the pitch (i.e., third distance L3) between two adjacent first branches 114.

Figure 4:
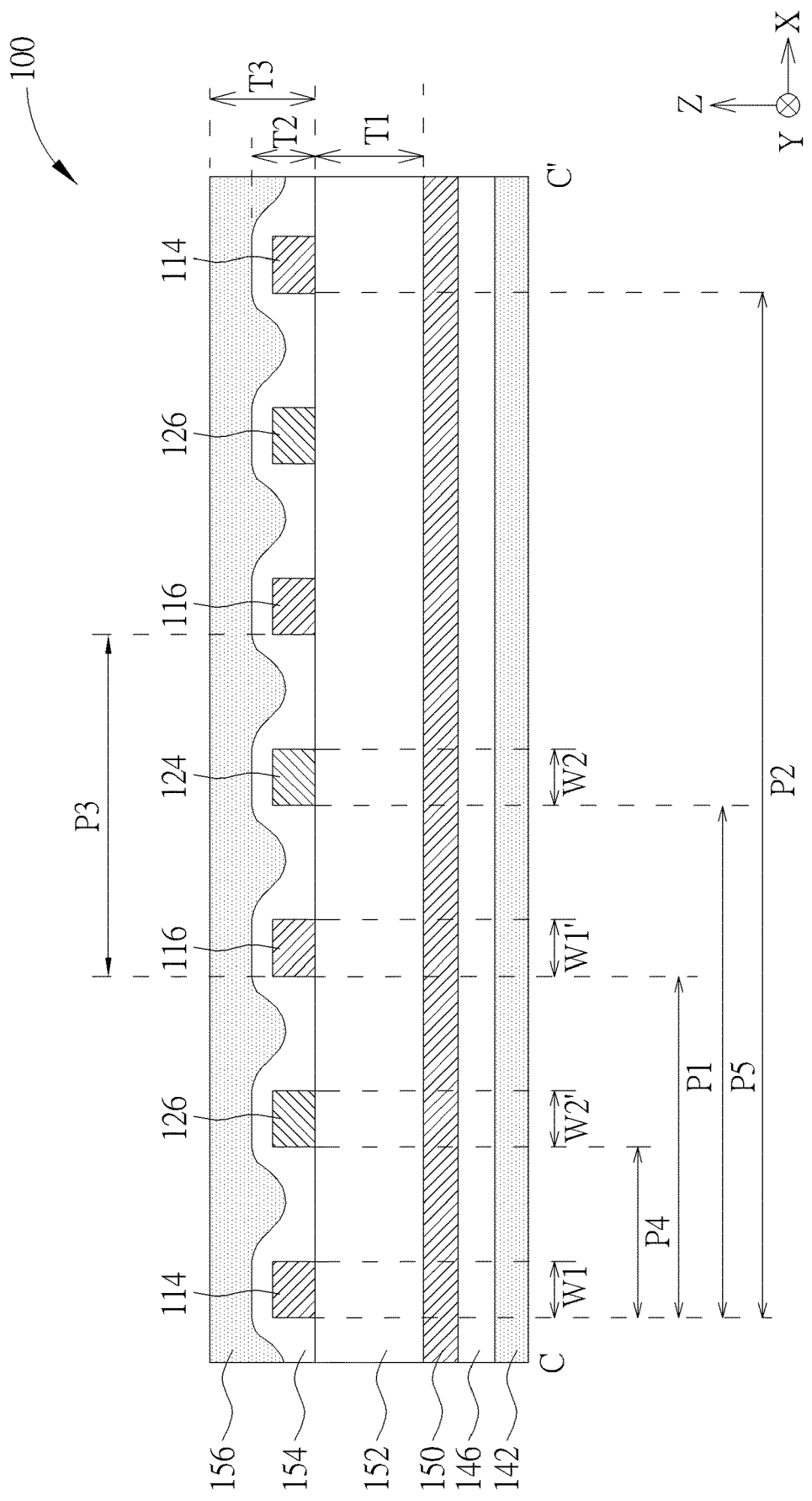
FIG. 4 is a schematic cross-sectional view taken along the line C-C' of FIG. 1 according to one embodiment of the present disclosure.

FIG. 4 is a schematic cross-sectional view taken along the line C-C' of FIG. 1 according to one embodiment of the present disclosure. Referring to FIG. 4, according to one embodiment of the present disclosure, the passivation layer 154 may fill up the spacing between the first branches 114, the second branches 124, the first floating electrodes 116 and the second floating electrodes 126, and may cover the top surfaces of the first branches 114, the second branches 124, the first floating electrodes 116 and the second floating electrodes 126.

According to one embodiment of the present disclosure, for the first floating electrodes 116, the number of the first floating electrodes 116 between two adjacent first branches 114 may be even (i.e., 2n, where n is a positive integer), such as 2, 4, 6, 8, etc., but is not limited thereto. In addition, the width W1 of each first floating electrode 116 or an average width of the first floating electrodes 116 is approximately equal to the width w1' of each first branch 114 or an average width of the first branches 114. Adjacent first floating electrodes 116 and first branches 114 may have a pitch, such as a first pitch P1, while adjacent two first branches 114 may have a pitch, such as a second pitch P2, so that the first pitch P1 and the second pitch P2 may satisfy a specific proportional relationship, such as 1:2n+1, where n is a positive integer and 2n is the total number of the first floating electrodes 116 and the second floating electrodes 126. In addition, the first floating electrodes 116 may be respectively disposed at two sides of each second branch 124, and there may be a pitch, e.g., a third pitch P3, may be between two adjacent first floating electrodes 116. A ratio between the third pitch P3 and the second pitch P2 (i.e., the pitch between two adjacent first branches 114) may satisfy a specific proportional relationship, such as satisfy a ratio of 1:2n+1, where n is a positive integer.

According to one embodiment of the present disclosure, for the second floating electrodes 126, the number of the second floating electrodes 126 between two adjacent first branches 114 may be even (i.e., 2n, where n is a positive integer), such as 2, 4, 6, 8, etc., but is not limited thereto. In addition, the width W2 or an average width of each second floating electrode 126 is approximately equal to the width w2' or an average width of each second branch 124. Adjacent second floating electrode 126 and first branch 114 may have a pitch, such as a fourth pitch P4, while adjacent first branch 114 and second branch 124 may have a pitch, such as a fifth pitch P5. A ratio between the fourth pitch P4 and the fifth pitch P5 may satisfy a specific proportional relationship, such as satisfy a ratio of 1:2n+1, where n is a positive integer.

Figure 5:
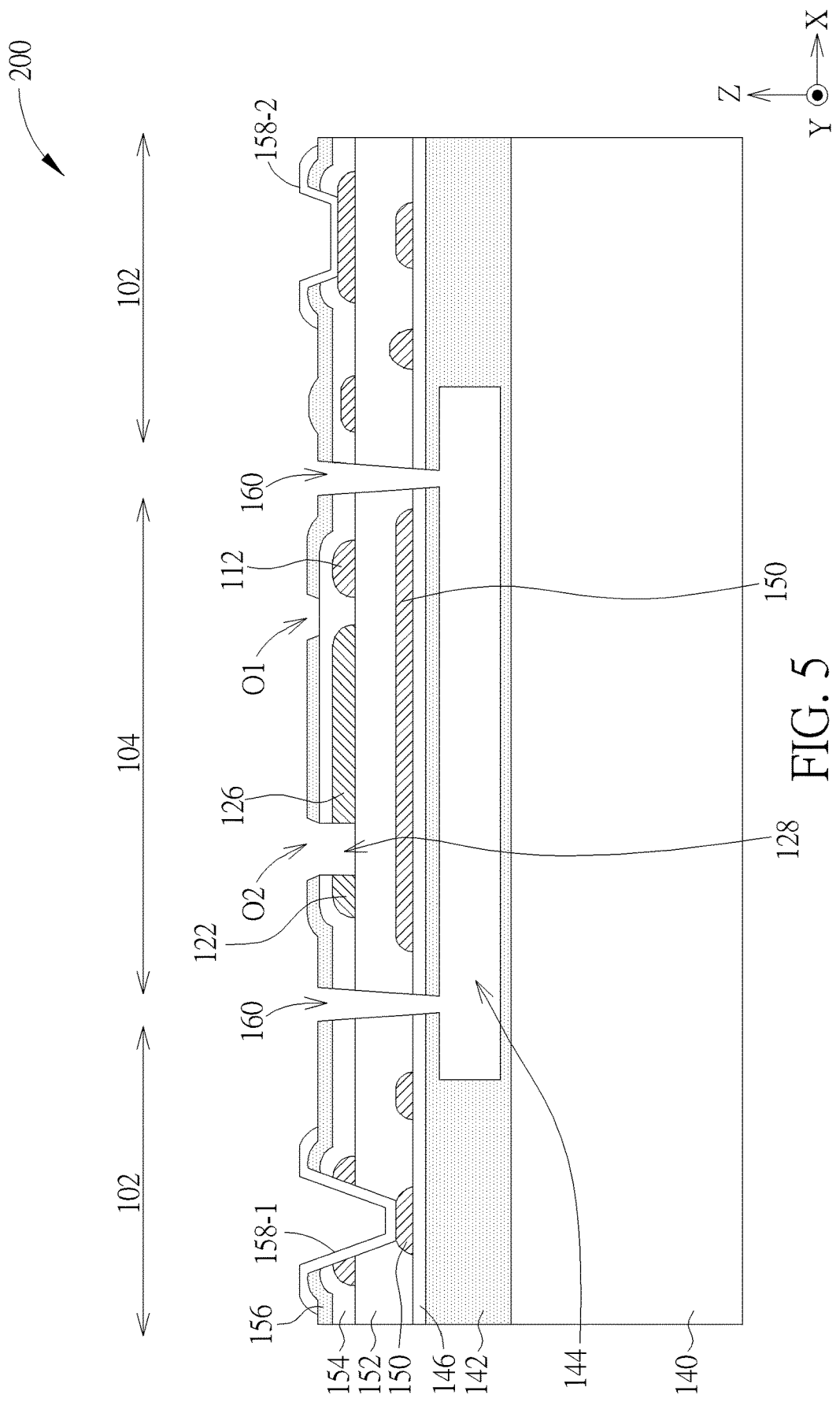
FIG. 5 is a schematic cross-sectional view taken along the line A-A' of FIG. 1 according to a variant embodiment of the present disclosure.
Figure 6:
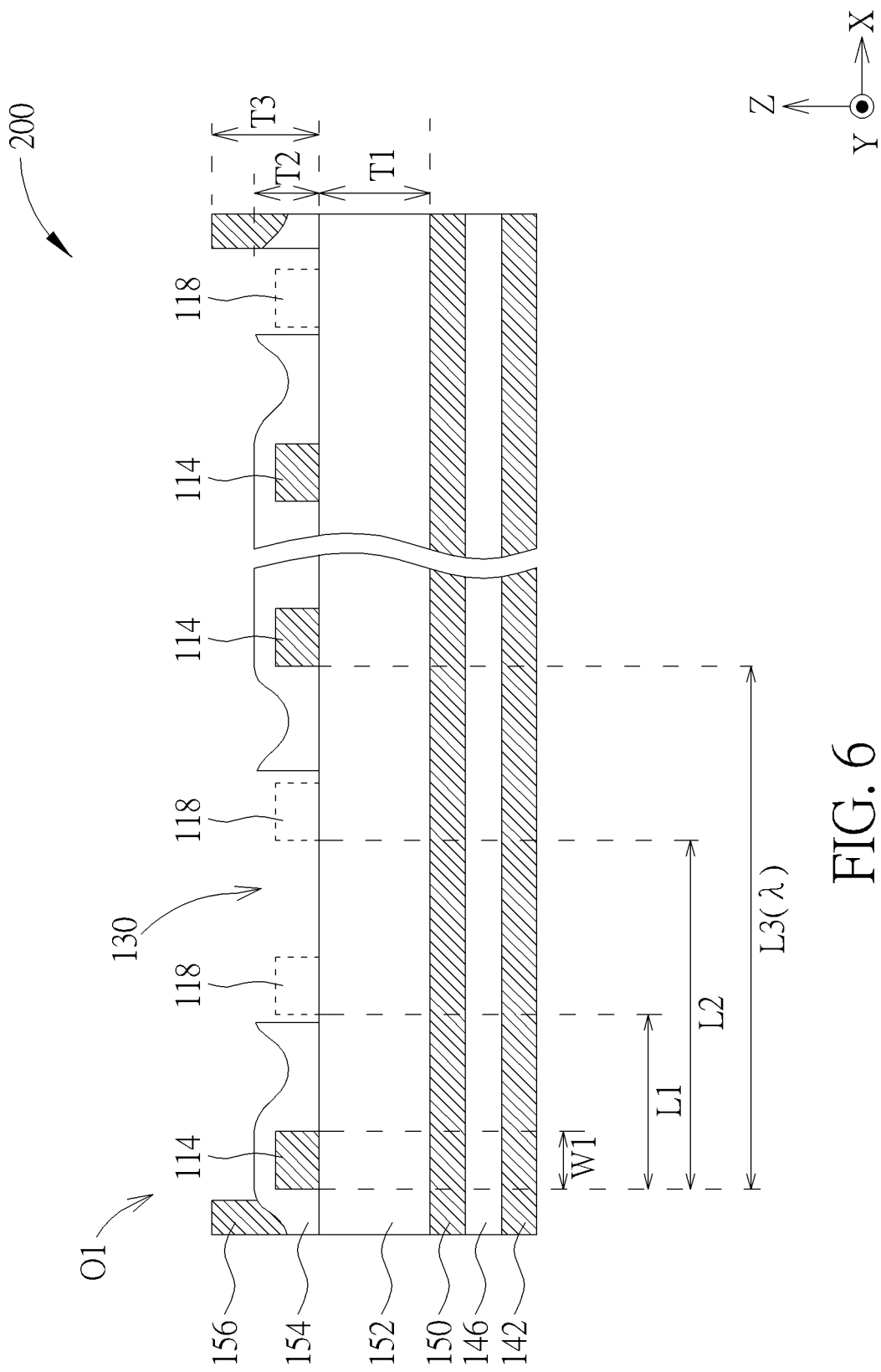
FIG. 6 is a schematic cross-sectional view taken along the line B-B' of FIG. 1 according to a variant embodiment of the present disclosure.

According to the above embodiments, the passivation layer 154 with a relatively thin thickness exists between the openings (e.g., the first opening O1 and the second opening O2) in the dielectric layer 156 and the isolation regions below the openings (e.g., the first isolation region 118 and the second isolation region 128), but the present disclosure is not limited thereto. According to other embodiments of the present disclosure, there may be no passivation layer 154 between the opening in the dielectric layer 156 and the isolation region below the opening. FIG. 5 is a schematic cross-sectional view taken along the line A-A' of FIG. 1, and FIG. 6 is a schematic cross-sectional view taken along the line B-B' of FIG. 1. Referring to FIG. 5, the second isolation region 128, such as a cavity, may be correspondingly arranged below the bottom surface of the second opening O2 of the Lamb wave resonator 200, and the cavity may be connected to the bottom surface of the second opening O2. According to the embodiment shown in FIG. 5, there is no passivation layer 154 between the second opening O2 and the second isolation region 128. Referring to FIG. 6, the cavity 130 may be formed in the passivation layer 154 to expose a portion of the piezoelectric material layer 152, and the cavity 130 may be connected to the bottom surface of the first opening O1. According to the embodiment shown in FIG. 6, the first isolation region 118 may be regarded as a part of the cavity 130.

For the Lamb wave resonators 100, 200 described in the above embodiments, the first floating electrodes 116 and the second floating electrodes 126 may be obtained by cutting off the first branches 114 and the second branches 124 with a specific pitch, by which the resonance frequency, e.g. the resonance frequency of $S_0$ mode, of the Lamb wave resonator 100 may be reduced. In this way, a ratio of the resonance frequency of the $S_0$ mode after cutting to the resonance frequency of the $S_0$ mode before cutting may substantially satisfies a ratio of 1:2n+1, where n is a positive integer.

Figure 7:
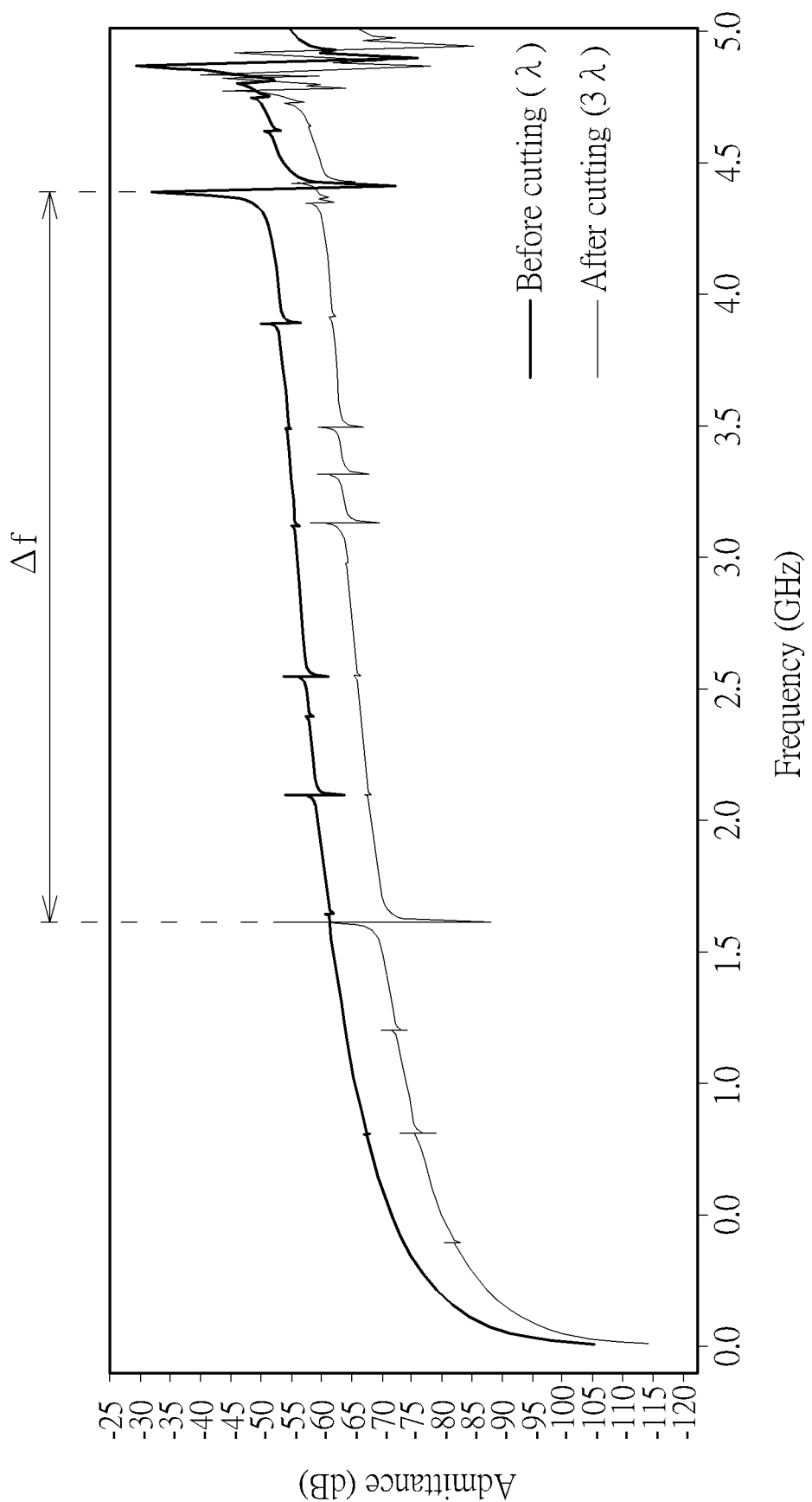
FIG. 7 is a diagram showing the change in resonance frequency of the Lamb wave resonator before and after cutting the branches according to embodiments of the present disclosure.

FIG. 7 is a diagram showing the change in the resonance frequency of the Lamb wave resonator before and after cutting the branches according to embodiments of the present disclosure. Referring to FIG. 7, for the Lamb wave resonator 100 similar to that shown in FIG. 1, for a case where there is only one pair of first floating electrode 116 and second floating electrode 126 between every two adjacent first branch 114 and second branch 124, the resonance frequency of S0 mode of the Lamb wave resonator 100 may be shifted by a value Δf from an initial resonance frequency before cutting (for example, about 4.5 GHz) to a final resonance frequency after cutting (for example, about 1.5 GHz). Therefore, a ratio of the final resonance frequency to the initial resonance frequency is about 1:3, which substantially satisfies the relationship of 1:2n+1, where n is a positive integer. In addition, according to one embodiment of the present disclosure, when the Lamb wave resonator is provided with a bottom electrode (e.g., the bottom electrode 150), the effective electromechanical coupling coefficient ($K_{eff}^2$) of the Lamb wave resonator may be kept to be greater than 1.0%, e.g., greater than 1.5%, regardless of the layout of the bottom electrode (flat bottom electrode or interdigitated bottom electrode) or electrical connection relationship of the bottom electrode (floating or grounded). In other words, for Lamb wave resonators with different numbers of floating electrodes and branches, when the bottom electrode is provided, the effective electromechanical coupling coefficient ($K_{eff}^2$) may be kept above a certain value. On the other hand, for the initial resonance frequency and the final resonance frequency of the Lamb wave resonator, the numerical range of measured resonance frequency allows a certain deviation. For example, the deviation within 20% is allowable error.

The following description will detail the different embodiments of Lamb waver resonators in the present disclosure. To simplify the description, the following description will detail the dissimilarities among the different embodiments and the identical features will not be redundantly described. In order to compare the differences between the embodiments easily, the identical components in each of the following embodiments are marked with identical symbols.

Figure 8:
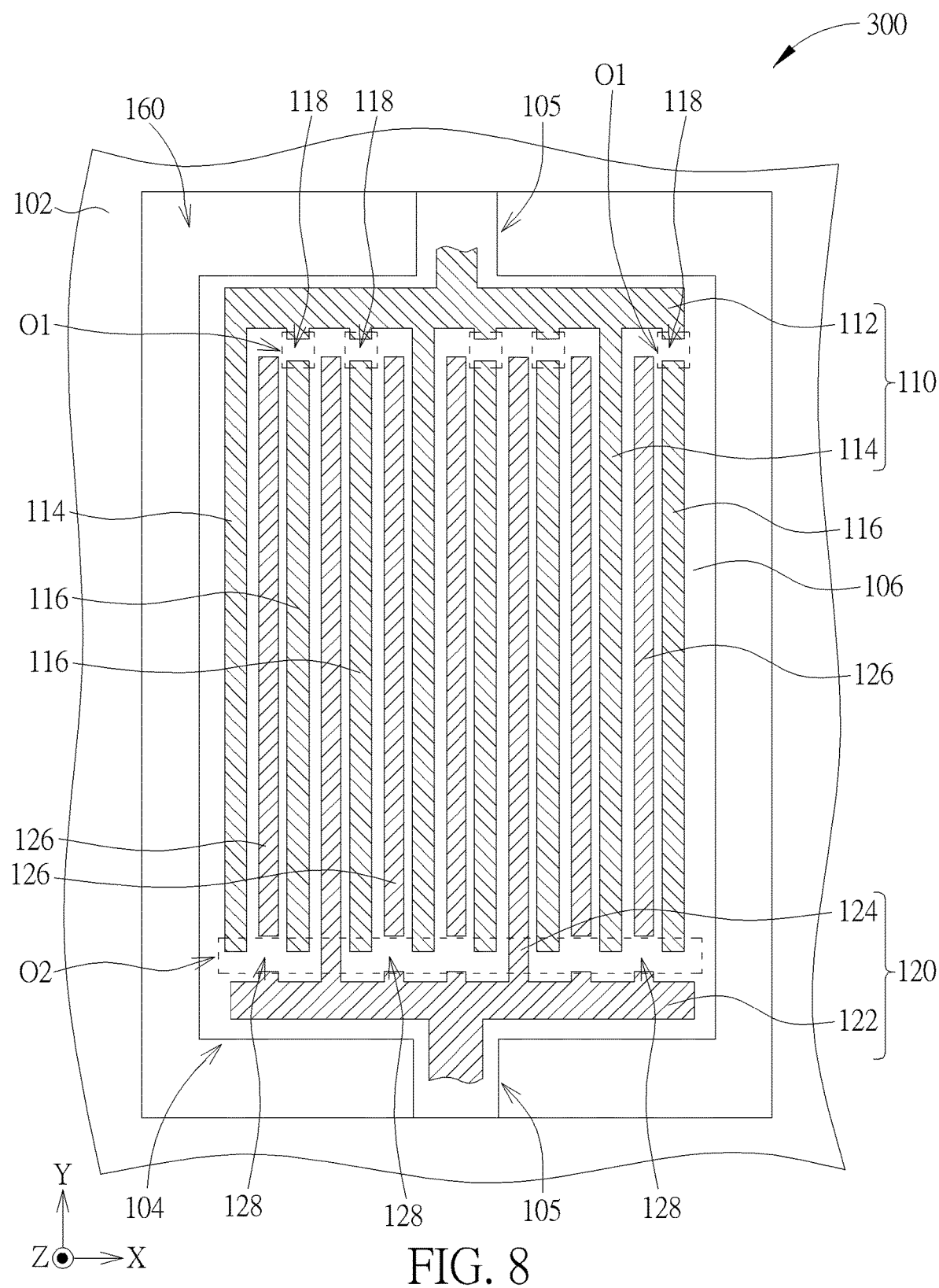
FIG. 8 is a schematic top view of a Lamb wave resonator according to a variant embodiment of the present disclosure.

FIG. 8 is a schematic top view of a Lamb wave resonator according to a variant embodiment of the present disclosure. Referring to FIG. 8, the Lamb wave resonator 300 shown in FIG. 8 is similar to the Lamb wave resonator 100 shown in FIG. 1. The main difference is that the first opening O1 shown in FIG. 8 is not a single strip-shaped opening, but several geometric openings separated from each other, for example, several openings intermittently distributed along the x direction. Each first opening O1 is arranged corresponding to one end of the first floating electrodes 116 and at least partially overlaps each first isolation region 118.

Figure 9:
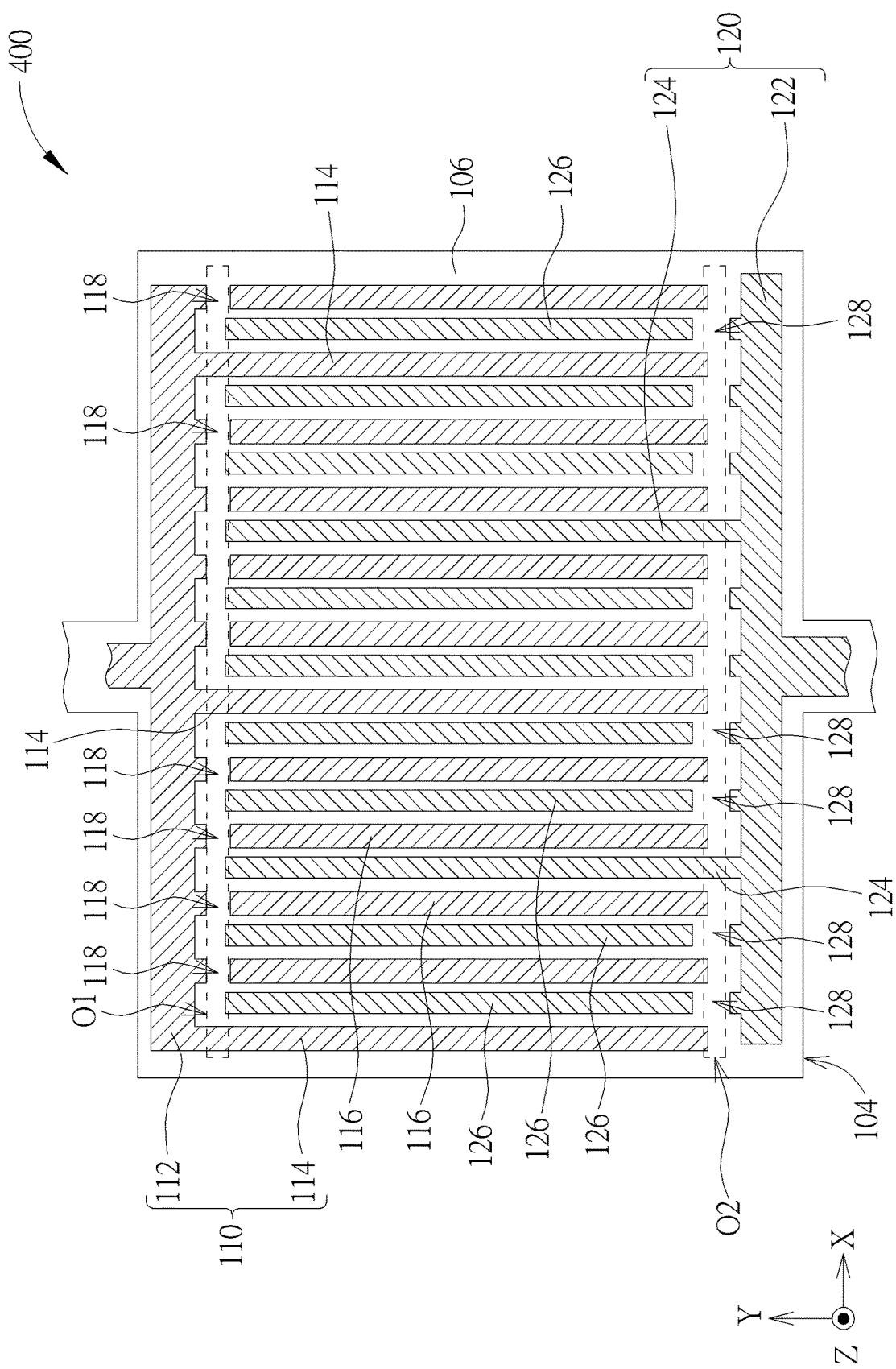
FIG. 9 is a schematic top view of a Lamb wave resonator according to a variant embodiment of the present disclosure.

FIG. 9 is a schematic top view of a Lamb wave resonator according to a variant embodiment of the present disclosure. Referring to FIG. 9, the Lamb wave resonator 400 shown in FIG. 9 is similar to the Lamb wave resonator 100 shown in FIG. 1. The main difference is that two pairs of the first floating electrodes 116 and the second floating electrodes 126 are arranged between every pair of adjacent first branch 114 and second branch 124. In other words, for the Lamb wave resonator 400 without the first floating electrodes 116 and the second floating electrodes 126, the resonance frequency of S0 mode may be the resonance frequency f1, while for the Lamb wave resonator 400 with the first floating electrodes 116 and the second floating electrodes 126, the resonance frequency of S0 mode may be the resonance frequency f2. The ratio between the resonance frequencies f1 and f2 may be about 5:1, which substantially satisfies the relationship of 2n+1:1, where n is a positive integer.

Figure 10:
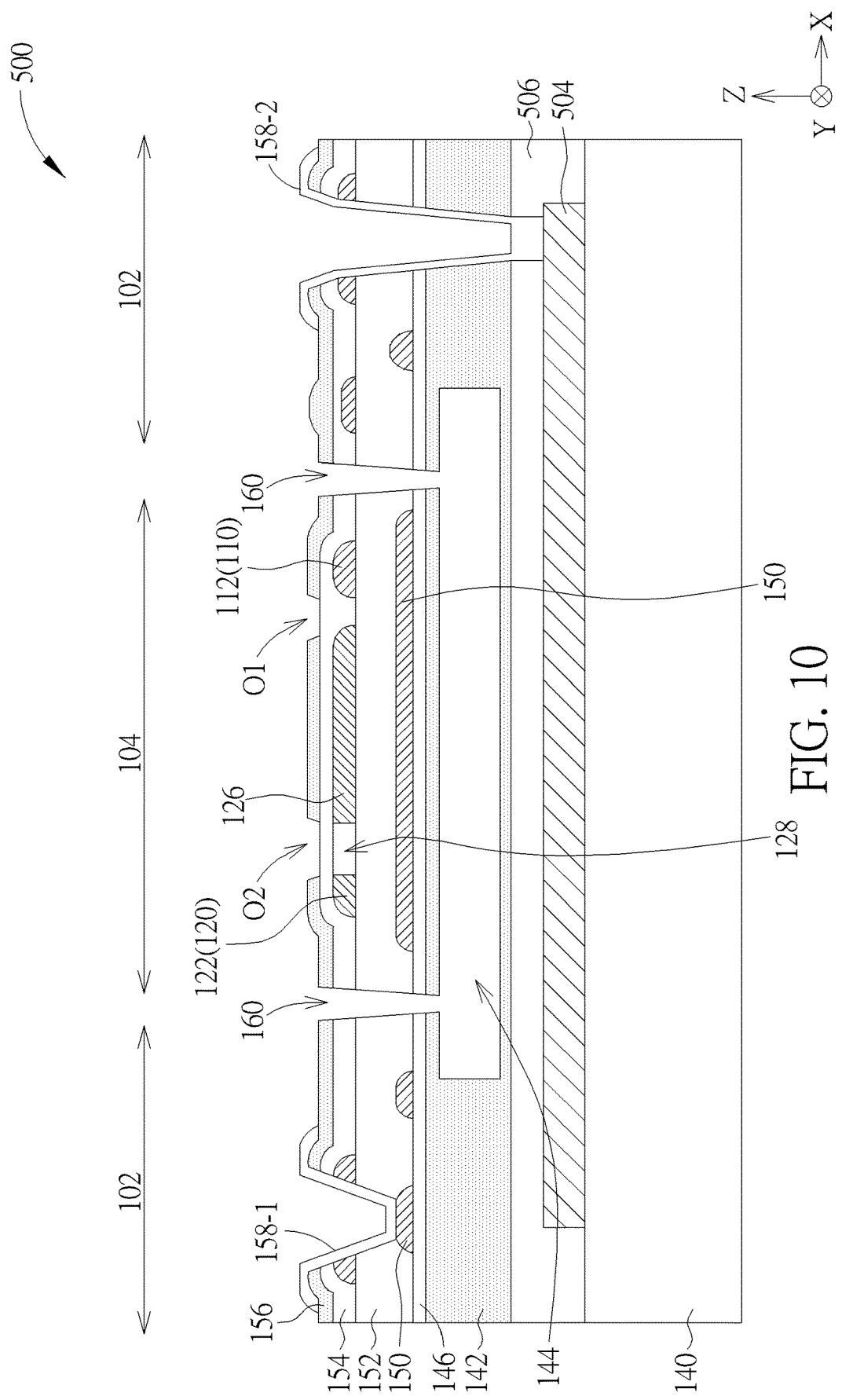
FIG. 10 is a schematic cross-sectional view taken along the line A-A' of FIG. 1 according to a variant embodiment of the present disclosure.

FIG. 10 is a schematic cross-sectional view taken along the line A-A' of FIG. 1 according to a variant embodiment of the present disclosure. Referring to FIG. 10, the Lamb wave resonator 500 shown in FIG. 10 is similar to the Lamb wave resonator 100 shown in FIG. 2. The main difference is that the Lamb wave resonator 500 may further include semiconductor elements, such as switching devices or amplifiers, disposed in the substrate 140, and include wire 504 and dielectric layer 506 electrically coupled to the semiconductor elements and disposed between the substrate 140 and the dielectric base layer 142. The bottom of the second contact pad 158-2 may penetrate through the dielectric base layer 142 and be electrically coupled to the wire 504. According to one embodiment of the present disclosure, the electrical signals transmitted from the semiconductor elements in the substrate 140 may be transmitted to the first finger electrode 110 or the second finger electrode 120 through the wire 504 and the second contact pad 158-2 in sequence.

Figure 11:
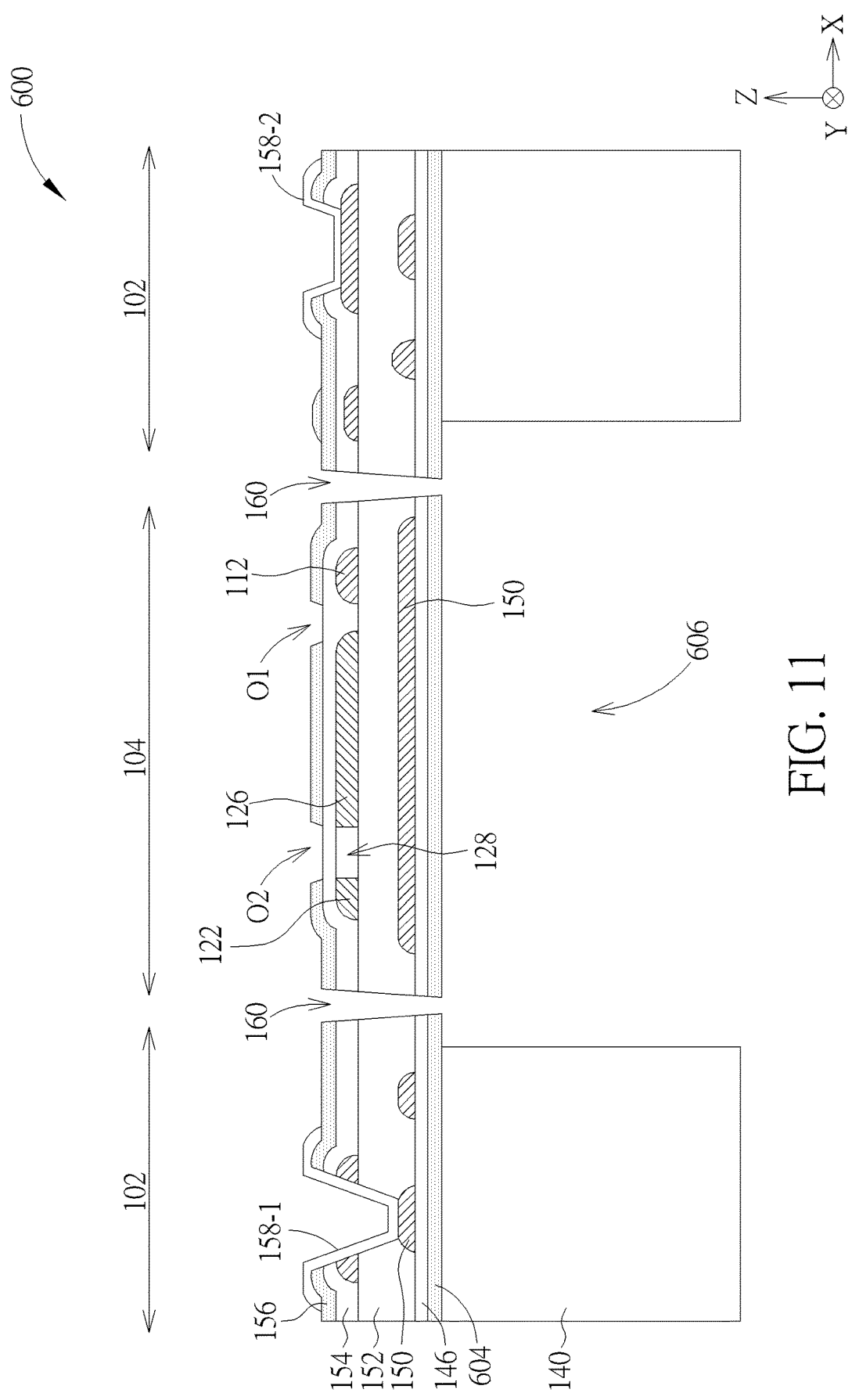
FIG. 11 is a schematic cross-sectional view taken along the line A-A' of FIG. 1 according to a variant embodiment of the present disclosure.

FIG. 11 is a schematic cross-sectional view taken along the line A-A' of FIG. 1 according to a variant embodiment of the present disclosure. Referring to FIG. 11, the Lamb wave resonator 600 shown in FIG. 11 is similar to the Lamb wave resonator 100 shown in FIG. 2. The main difference is that a cavity 606 is provided in the substrate 140, and a thin dielectric layer 604 is provided between the substrate 140 and the seed layer 146. According to one embodiment of the present disclosure, the suspension portion 104 may oscillate in the cavity 606 in the substrate 140 when the Lamb wave resonator 600 resonates. In another variant embodiment, the substrate 140 may be a semiconductor-on-insulator substrate, such as a silicon-on-insulator layer substrate.

In order to enable one of ordinary skill in the art to implement the present disclosure, a method of fabricating a Lamb wave resonator is further described below. Besides, as a Lamb wave resonator may be fabricated by standard CMOS processes, associated electronics, such as FET, amplifiers, and integrated circuits, may also be fabricated on the same substrate of the Lamb wave resonator by the same CMOS process.

Figure 12:
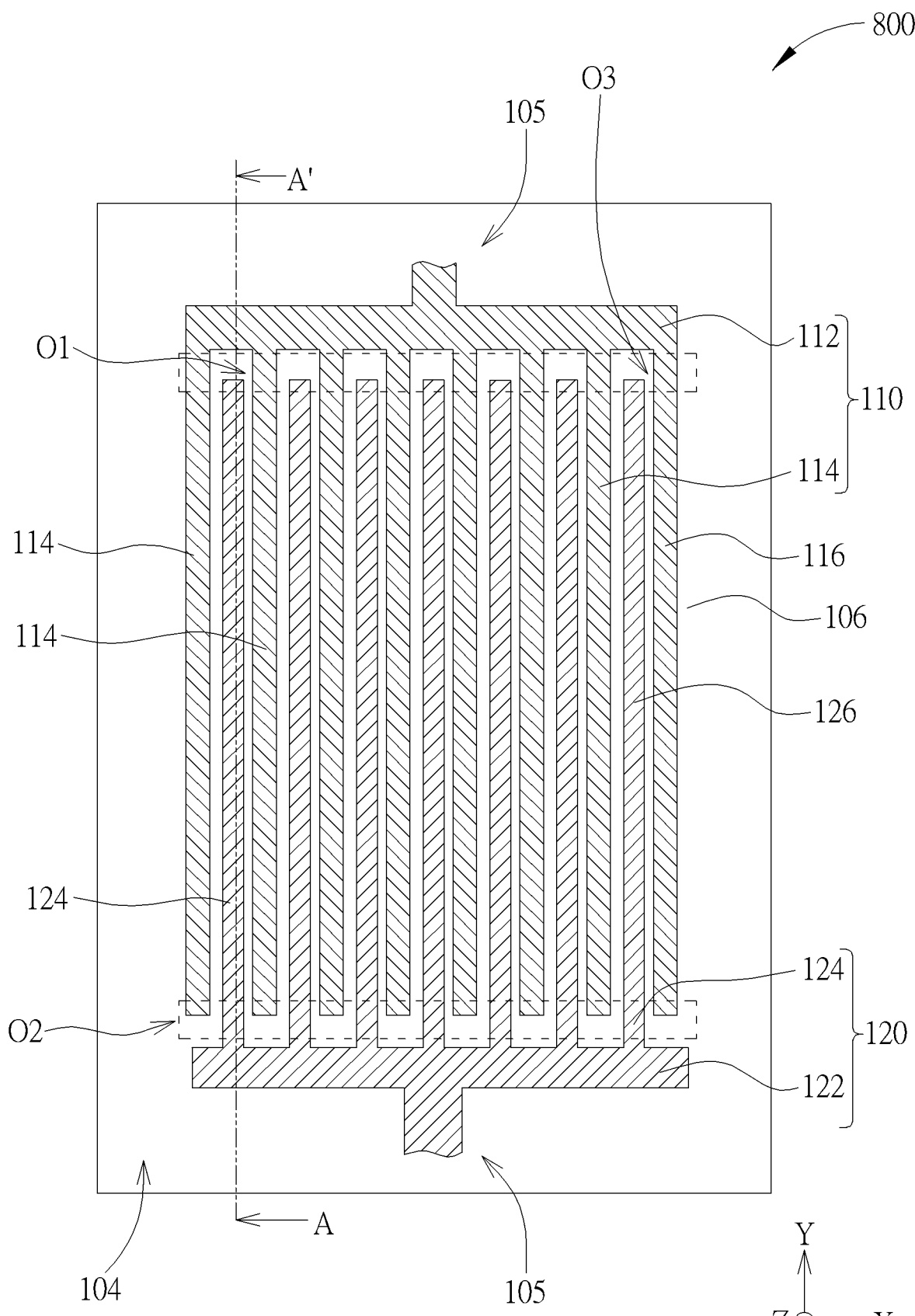
FIG. 12 is a schematic top view of fabricating a Lamb wave resonator according to one embodiment of the present disclosure.

FIG. 12 is a schematic top view of fabricating a Lamb wave resonator according to one embodiment of the present disclosure. Referring to FIG. 12, the first finger electrode 110 and the second finger electrode 120 of the Lamb wave resonator 800 may be disposed on the top side of the piezoelectric material layer 106, and the first opening O1 and the second opening O2 may be strip-shaped openings and may be disposed at one end of the second branch 124 and one end of the first branch 114, respectively.

Figure 13:
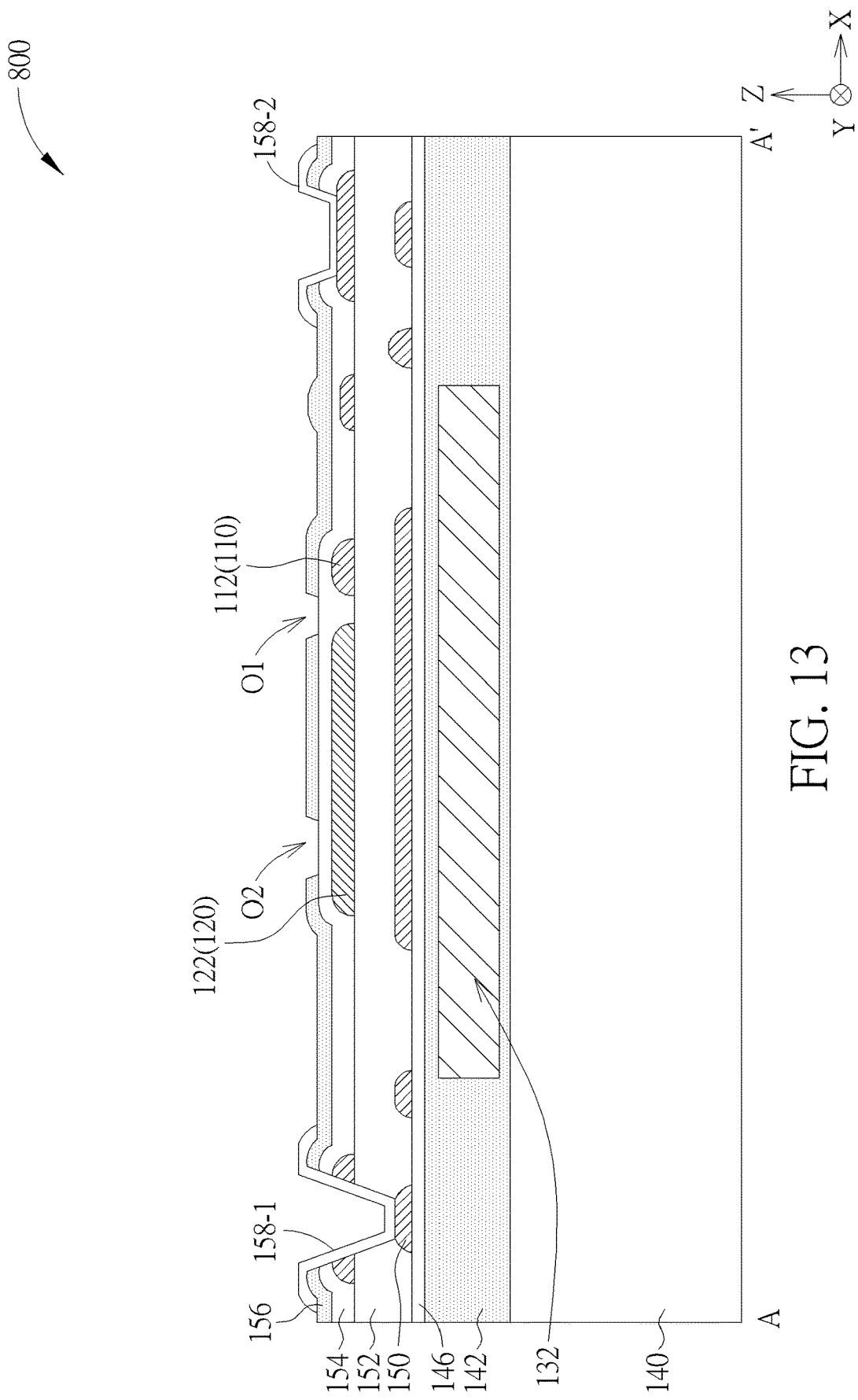
FIG. 13 is a schematic cross-sectional view taken along the line A-A' of FIG. 12 according to one embodiment of the present disclosure.

FIG. 13 is a schematic cross-sectional view taken along the line A-A' in FIG. 12 according to one embodiment of the present disclosure. Referring to FIG. 13, a Lamb wave resonator 800 may include a substrate 140, and a dielectric base layer 142 and a sacrificial layer 132 are disposed between the substrate 140 and a seed layer 146. The materials of the dielectric base layer 142 and the sacrificial layer 132 are different, so that the dielectric base layer 142 and the sacrificial layer 132 may be removed by etchants at different rates in the subsequent etching process. According to one embodiment of the present disclosure, the passivation layer 154 may completely cover the top electrode (e.g., the first finger electrode 110 and the second finger electrode 120) and fill up the spacing between the first finger electrode 110 and the second finger electrode 120.

Figure 14:
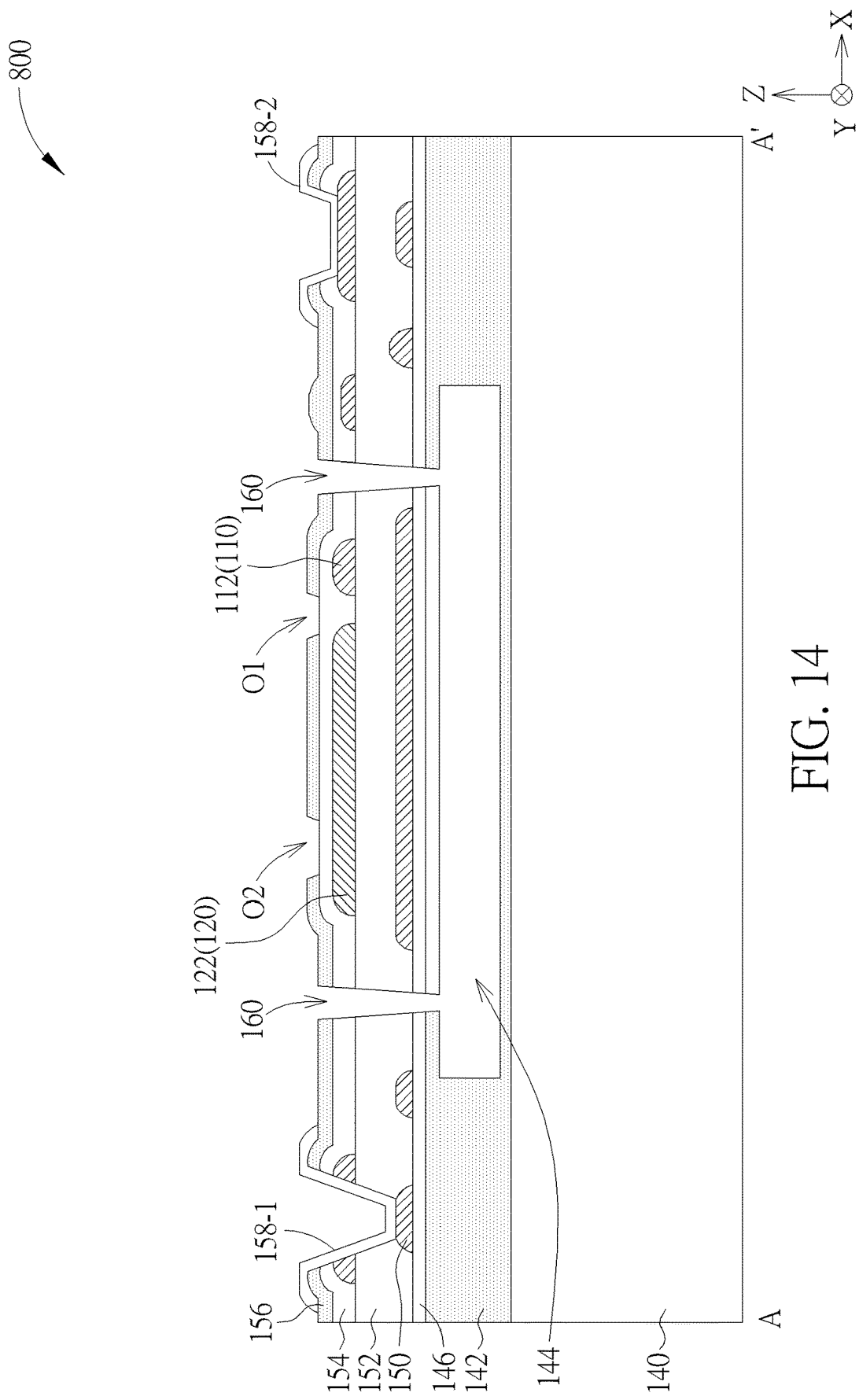
FIG. 14 is a schematic cross-sectional view after removing a sacrificial layer according to one embodiment of the present disclosure.

FIG. 14 is a schematic cross-sectional view after removing the sacrificial layer according to one embodiment of the present disclosure. Referring to FIG. 14, at least one gap 160 penetrating the piezoelectric material layer 150 may be formed, and etchants may be supplied to the sacrificial layer 132 through the gap 160 to etch and remove the sacrificial layer 132, thereby forming a cavity 144 below the piezoelectric material layer 152. Therefore, after removing the sacrificial layer 132, the Lamb wave resonator 800 may include a frame portion 102 and a suspension portion 104, where the frame portion 102 may surround the periphery of the suspension portion 104.

Subsequently, a laser cutting process may be further performed to focus laser energy on a portion of the first branch 114 directly below the first opening O1 and a portion of the second branch 124 below the second opening O2, so that a portion of the first branch 114 and a portion of the second branch 124 may be melted and/or vaporized to form a first isolation region 118 and a second isolation region 128 in the corresponding regions and concurrently form first floating electrodes 116 and second floating electrodes 126. Thus, structures shown in embodiments of FIG. 2 and FIG. 3 may be obtained. According to one embodiment of the present disclosure, since the thicknesses of the dielectric layer 156 and the passivation layer 154 affect the focusing depth of laser energy, the laser energy may be more easily transmitted to a predetermined depth by forming the first opening O1 and the second opening O2 in the dielectric layer 156 or the passivation layer 154.

Figure 15:
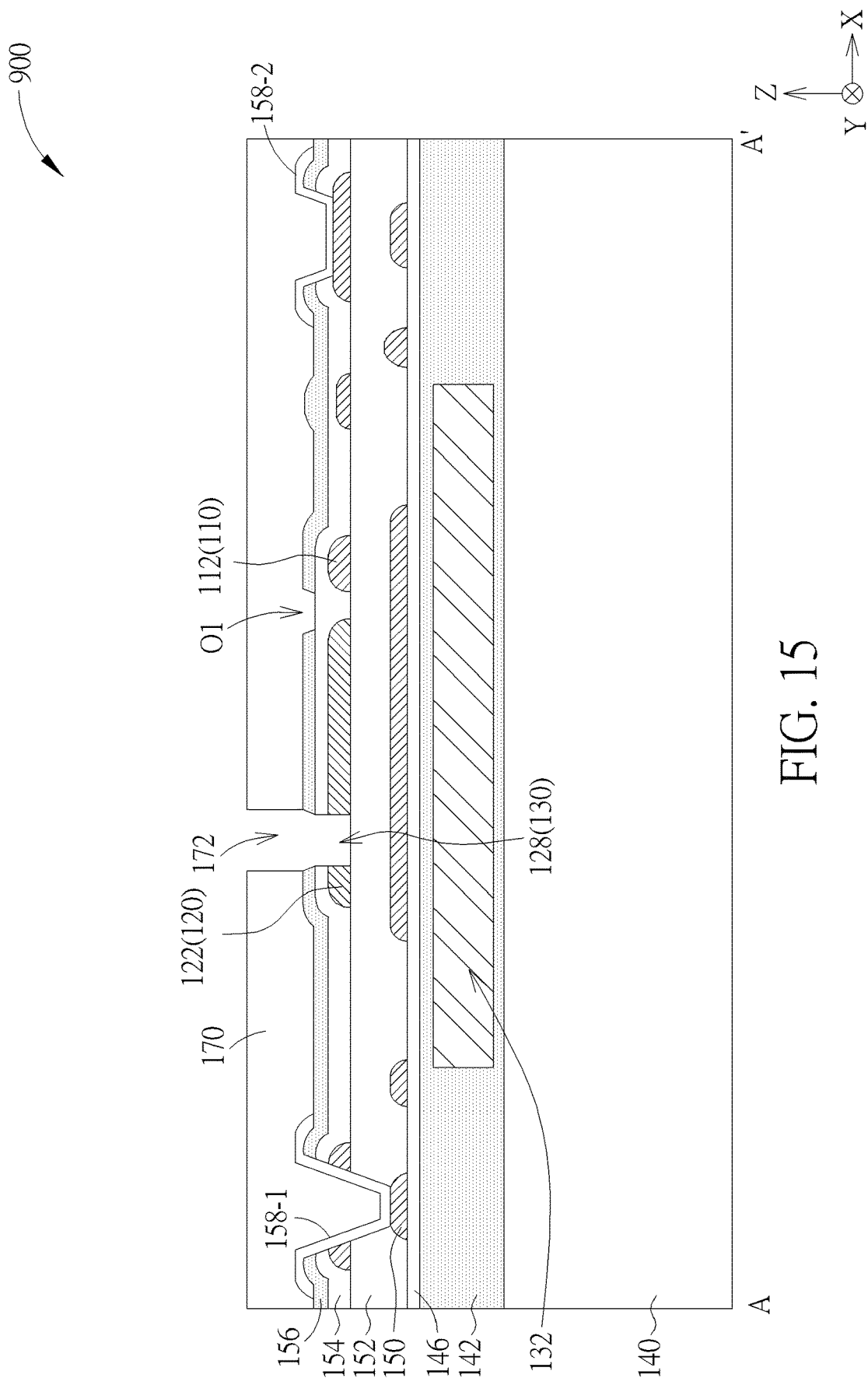
FIG. 15 is a schematic cross-sectional view after removing a portion of a second branch according to a variant embodiment of the present disclosure.

According to a variant embodiment of the present disclosure, the method of forming the first isolation region 118 and the second isolation region 128 is not limited to laser cutting, but may be a photolithography and etching process by which a portion of the first branch 114 and a portion of the second branch 124 may be removed to form the first isolation region 118 and the second isolation region 128. FIG. 15 is a schematic cross-sectional view according to a variant embodiment of the present disclosure after removing a portion of the second branch. After the process shown in FIG. 14, referring to FIG. 15, a patterned photoresist 170 having several openings 172 may be formed by photolithography. Then, an etching process may be performed to remove the passivation layer 154, the first branch 114, and the second branch 124 exposed from the bottom of each opening 172, thereby forming isolation regions 118, 128, such as a cavity 130, below the opening 172. When the etching process is completed, the required floating electrodes 116, 126 may be obtained.

Subsequently, the patterned photoresist may be removed, and another photolithography and etching process may be used to form at least one gap which penetrates the piezoelectric material layer 152. Then, etchants may be supplied to the sacrificial layer 132 through the gap to etch and remove the sacrificial layer 132, thereby forming a cavity under the piezoelectric material layer 152. The corresponding structures are shown in the embodiments of FIG. 2 and FIG. 3.

According to another variant embodiment of the present disclosure, the time of performing photolithography and etching processes to form the first isolation region 118 and the second isolation region 128 is not limited to be after depositing the dielectric layer 156, but may also be before depositing the dielectric layer 156 or before depositing the passivation layer 154. According to one embodiment of the present disclosure, after forming the first finger electrode 110 and the second finger electrode 120, but before depositing the passivation layer 154 or the dielectric layer 156, a photolithography process may be performed to form a patterned photoresist on the first finger electrode 110 and the second finger electrode 120 to define a region where the first finger electrode 110 and the second finger electrode 120 are to be cut off in the subsequent process. Thereafter, an etching process may be performed to cut off portions of the first finger electrode 110 and the second finger electrode 120 to obtain the required floating electrodes 116, 126. At this time, the plan view of the floating electrodes 116, 126 may be similar to the structure shown in the embodiments of FIG. 1, FIG. 8 and FIG. 9, but is not limited thereto. After that, subsequent processes for fabricating the Lamb wave resonator may be performed, for example, processes similar to those described in the above embodiments, so as to obtain the required Lamb wave resonator.

According to the above embodiments, by cutting off the branches with a specific pitch (such as cutting off paired first branch and the second branch), the resonance frequency of the modified Lamb wave resonator, such as the resonance frequency in $S_0$ mode, could be down to a relatively low value compared with the resonance frequency of the original Lamb wave resonator. Therefore, for fabricating Lamb wave resonators with different resonance frequencies, it is not necessary to redesign the layout or pitches of the branches of the finger electrodes for each Lamb wave resonator, but only use a reticle with an original layout of finger electrodes followed by a laser cutting process, or photolithography and etching processes, to cut off the branches with a specific pitches. By performing the processes above, the resonance frequency of the modified Lamb wave resonator could be lower than the resonance frequency of the original Lamb wave resonator.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A Lamb wave resonator, comprising:
    a piezoelectric material layer;
    a first finger electrode disposed on one side of the piezoelectric material layer, wherein the first finger electrode comprises a first main portion and a plurality of first branches;
    a second finger electrode disposed on the side of the piezoelectric material layer, wherein the second finger electrode comprises a second main portion and a plurality of second branches, each of the first branches and each of the second branches are parallel to each other and alternately arranged;
    at least two floating electrodes disposed between each of the first branches and each of the second branches; and
    at least two gaps disposed at two ends of each of the floating electrodes respectively.

2. The Lamb wave resonator according to claim 1, further comprising:
    a dielectric layer, covering the first finger electrode, the second finger electrode and the at least two floating electrodes; and
    at least two openings, disposed in the dielectric layer and corresponding to the gaps.

3. The Lamb wave resonator according to claim 2, further comprising:
    at least one isolation region disposed on at least one end of each of the floating electrodes and overlapping at least one of the gaps.

4. The Lamb wave resonator according to claim 3, further comprising:
    a passivation layer covering the at least one isolation region, wherein a portion of the passivation layer is exposed from each of the openings.

5. The Lamb wave resonator according to claim 3, wherein the at least one isolation region is a cavity.

6. The Lamb wave resonator according to claim 3, wherein the at least two floating electrodes comprise at least two first floating electrodes, and the at least one isolation region is disposed between each of the first floating electrodes and the first main portion.

7. The Lamb wave resonator according to claim 1, wherein the at least two floating electrodes comprise:
    at least one first floating electrode; and
    at least one second floating electrode disposed between each of the first branches and each of the second branches and disposed adjacent to the at least one first floating electrode.

8. The Lamb wave resonator according to claim 7, wherein the width of each of the second branches is the same as the width of the at least one second floating electrode.

9. The Lamb wave resonator according to claim 7, wherein the at least one second floating electrode is disposed between adjacent two of the first branches, and the number of the at least one second floating electrode is even and represented as 2n, where n is a positive integer.

10. The Lamb wave resonator according to claim 7, wherein none of the first branches and second branches are disposed between the at least one first floating electrode and the at least one second floating electrode being adjacent to the at least one first floating electrode.

11. The Lamb wave resonator according to claim 7, wherein the at least one first floating electrode and the at least one second floating electrode dispose in pairs.

12. The Lamb wave resonator according to claim 7, further comprising:
- a dielectric layer covering the at least two floating electrodes;
- at least one first opening disposed in the dielectric layer and disposed corresponding to one end of the at least one first floating electrode; and
- at least one second opening disposed in the dielectric layer and disposed corresponding to one end of the at least one second floating electrode, wherein the end of the second floating electrode is away from the end of the first floating electrode.

13. The Lamb wave resonator according to claim 1, wherein the at least two floating electrodes comprise at least two first floating electrodes, each of the first floating electrodes is disposed between adjacent two of the first branches, and the number of the floating electrodes is even and represented as 2n, where n is a positive integer.

14. The Lamb wave resonator according to claim 13, wherein the at least two floating electrodes further comprise at least one second floating electrode, and there is a pitch between adjacent each of the first branches and the at least one second floating electrode, and there is a further pitch between adjacent each of the first branches and each of the second branches, and the ratio of the pitch to the further pitch is 1:2n+1, where n is a positive integer.

15. The Lamb wave resonator according to claim 1, wherein the width of each of the first branches is the same as the width of each of the first floating electrodes.

16. The Lamb wave resonator according to claim 1, further comprising a bottom electrode disposed on another side of the piezoelectric material layer.

17. The Lamb wave resonator according to claim 1, wherein:
- the first branches comprise at least two first branches disposed on one side of the piezoelectric material layer;
- the second branches comprise at least one second branch disposed on the side of the piezoelectric material layer and disposed between the first branches; and
- the at least two floating electrodes comprise at least two first floating electrodes disposed on the side of the piezoelectric material layer, wherein the at least two first floating electrodes are respectively disposed at two sides of the at least one second branch and disposed between the first branches, wherein there is a first pitch between adjacent each of the first floating electrodes and each of the first branches, and there is a second pitch between adjacent two of the first branches, and the ratio of the first pitch to the second pitch is 1:2n+1, where n is a positive integer.

18. The Lamb wave resonator according to claim 1, wherein the first branches are electrically coupled to an input terminal of electrical signal, and the second branches are electrically coupled to an output terminal of electrical signal.

19. The Lamb wave resonator according to claim 1, wherein the floating electrodes are electrically insulated from each of the first branches and each of the second branches.

* * * * *